United States Patent
Kotegawa et al.

(10) Patent No.: US 8,155,328 B2
(45) Date of Patent: Apr. 10, 2012

(54) SOUND REPRODUCING APPARATUS

(75) Inventors: Kazuhisa Kotegawa, Osaka (JP);
Fumiyasu Konno, Osaka (JP);
Shinnosuke Nagasawa, Osaka (JP);
Masahide Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 1144 days.

(21) Appl. No.: 11/916,477

(22) PCT Filed: Apr. 19, 2007

(86) PCT No.: PCT/JP2007/058503
§ 371 (c)(1),
(2), (4) Date: Dec. 4, 2007

(87) PCT Pub. No.: WO2007/123172
PCT Pub. Date: Nov. 1, 2007

(65) Prior Publication Data
US 2009/0225995 A1 Sep. 10, 2009

(30) Foreign Application Priority Data
Apr. 20, 2006 (JP) ................. 2006-116426

(51) Int. Cl.
*H03G 3/20* (2006.01)
(52) U.S. Cl. ............... 381/57; 381/56; 381/58; 381/59; 381/104; 381/107
(58) Field of Classification Search ........... 381/57, 381/86, 94, 56, 58, 59, 104, 107, 108
See application file for complete search history.

(56) References Cited

U.S. PATENT DOCUMENTS

| 5,541,866 | A | 7/1996 | Sato et al. |
| 5,907,622 | A | 5/1999 | Dougherty |
| 7,840,012 | B2 | 11/2010 | De Poortere |
| 2004/0240676 | A1* | 12/2004 | Hashimoto et al. ............. 381/56 |
| 2006/0188104 | A1 | 8/2006 | De Poortere |
| 2008/0285768 | A1* | 11/2008 | Larsen et al. ................. 381/73.1 |

FOREIGN PATENT DOCUMENTS

| JP | 63-296405 | | 12/1988 |
| JP | 1-137610 | | 9/1989 |
| JP | 1-137610 U | | 9/1989 |
| JP | 05-152982 | | 6/1993 |
| JP | 07-307632 | | 11/1995 |
| JP | 08-036806 | | 2/1996 |
| JP | 08036806 A | * | 2/1996 |
| JP | 09-232896 | | 9/1997 |

(Continued)

OTHER PUBLICATIONS

International Search Report Dated Jul. 10, 2007.
European Search Report for Appl. No. EP 07741939 dated Mar. 31, 2010.

(Continued)

*Primary Examiner* — Kimberly Nguyen
*Assistant Examiner* — Errol Fernandes
(74) *Attorney, Agent, or Firm* — Pearne & Gordon LLP

(57) ABSTRACT

An sound reproducing apparatus is configured such that a correction amount is calculated on the basis of a masking model, determiner for determining a correction parameter correcting input signal so as to be natural for human ears to hear on the basis of the calculated correction amount is provided, and a characteristic of correction filter is changed on the basis of a result of determiner when inputting vehicle speed information.

5 Claims, 7 Drawing Sheets

FOREIGN PATENT DOCUMENTS

| | | | | |
|---|---|---|---|---|
| JP | 09232896 | A | * | 9/1997 |
| JP | 11-184475 | | | 7/1999 |
| JP | 11184475 | A | * | 7/1999 |
| JP | 2002-354599 | | | 12/2002 |
| JP | 2002354599 | A | * | 12/2002 |
| JP | 2003-047097 | | | 2/2003 |
| JP | 2003-273677 | | | 9/2003 |
| JP | 2003273677 | A | * | 9/2003 |
| JP | 2004-008482 | A | | 1/2004 |
| JP | 2007-500466 | A | | 1/2007 |
| WO | 2005/011111 | A2 | | 2/2005 |

OTHER PUBLICATIONS

Japanese Office Action for JP 2006-116426 dated Sep. 6, 2011.
Translation of JP-09-232896 A dated Sep. 5, 1997.
Translation of JP-08-036806 A dated Feb. 6, 1996.
Translation of JP-2002-354599 A dated Dec. 6, 2002.
Translation of JP-2003-273677 A dated Sep. 26, 2003.
Translation of JP-11-184475 A dated Jul. 9, 1999.
Abstract of JP-63-296405 A dated Dec. 2, 1998.
JP-5-152982 A dated Jun. 18, 1993, corresponding to US 5,541,866 A.

* cited by examiner

SOUND REPRODUCING APPARATUS

This Application is A U.S. National Phase Application of PCT International Application PCT/JP2007/058503.

TECHNICAL FIELD

The present invention relates to a sound reproducing apparatus capable of playing music with a satisfactory sound quality in a driving vehicle without any disturbance of music masking caused by a driving noise.

BACKGROUND ART

As a function of a known sound reproducing apparatus mounted on a vehicle, there is known a noise responsive controller for correcting a gain of each frequency so as to listen to music even in a noise environment by using a masking model. In addition, an example of the prior art related to the present application includes Patent Document 1.

However, in a sound reproducing apparatus having the noise responsive controller for correcting a music signal so as not to be masked with a noise with an increase in a noise, when the music signal is corrected on the basis of the known masking model, a correction amount is so considerably increased that a listener can sense what the music signal is being corrected. For this reason, the known correction method results in disturbing a natural music play.

As correction methods of correcting the music signal, there have been contrived three types of correction methods: the correction method of changing a volume itself, the correction method of using a correction filter of each bandwidth in the state where the frequency bandwidth is divided in detail, and the correction method of using an adaptive filter or the like. Even when the correction methods are used, all of the correction methods may disturb a natural music listening at the time of inputting music as an input signal. It is considered that the reason is why as it is clear from a cocktail party effect, humans have an acoustic sense ability to discern a different sound source at the time of listening to some extent. For example, when the adaptive filter with a complicated filter shape is added to the music signal, humans can sense unnaturalness.

Further, in order to use a masking amount as the correction amount, as a specific calculation equation of the masking amount, for example, an experimental equation based on an acoustic psychology is used. However, the experimental equation based on the acoustic psychology is an experimental equation obtained by not a masking model of a music signal from a sound reproducing apparatus, but a masking model of a noise source such as a pure sound, a band noise, or a white noise. For this reason, when the experimental equation based on the acoustic psychology is applied to real music and a noise source, a correction amount becomes particularly large in a low pass in which a large power is concentrated. As a result, a natural music listening is notably disturbed.

[Patent Document 1] Japanese Patent Unexamined Publication No. 7-307632

SUMMARY OF THE INVENTION

According to an aspect of the invention, there is provided a sound reproducing apparatus including an equalizer having characteristics fixed in advance and adjusting a tone of the input signal; a correction filter correcting a frequency characteristic of an output signal of the equalizer on the basis of a control signal; a volume adjusting a gain of an output signal of the correction filter; a power amplifier receiving an output of the volume as an input; a speaker sending an output signal of the power amplifier as an output signal sound; a memory storing a correction parameter in advance; and a selector selecting a correction parameter of the correction filter stored in the memory on the basis of a signal of vehicle speed and a setting value of the volume and transmitting the correction parameter as the control signal to the correction filter.

In the sound reproducing apparatus according to the invention, a microphone; a calculator; a computer; and a determiner are further provided.

the microphone mounted on the inside of a vehicle acquires a pink noise response sound which is an output signal sound, from the speaker, corresponding to a setting value of each volume of all values of the volume, a reference noise which is a noise during a stop, and a driving noise which includes vehicle speed information at the time of driving at a vehicle speed every predetermined interval, when the input signal is set to a pink noise, a frequency characteristic of the correction filter is set to be flat, and a gain thereof is set to 1.

The calculator calculates sound pressure levels of the pink noise response sound, the reference noise, and the driving noise acquired every multiple bandwidth, and calculates sound intensities on the basis of the sound pressure levels.

The computer computes a correction amount of a frequency characteristic including a gain every multiple bandwidth of the pink noise response sound every vehicle speed in a setting value of each volume of all values of the volume on the basis of a result of the calculator, so as to be the same as a sound intensity when the pink noise response sound is masked with the reference noise when the pink noise response sound is masked with the driving noise, so that a sound intensity becomes small.

The determiner determines a correction parameter of the correction filter so as to be natural for human ears to hear on the basis of a result of the computer and stores the determined correction parameter in the memory in advance.

Figure 1:
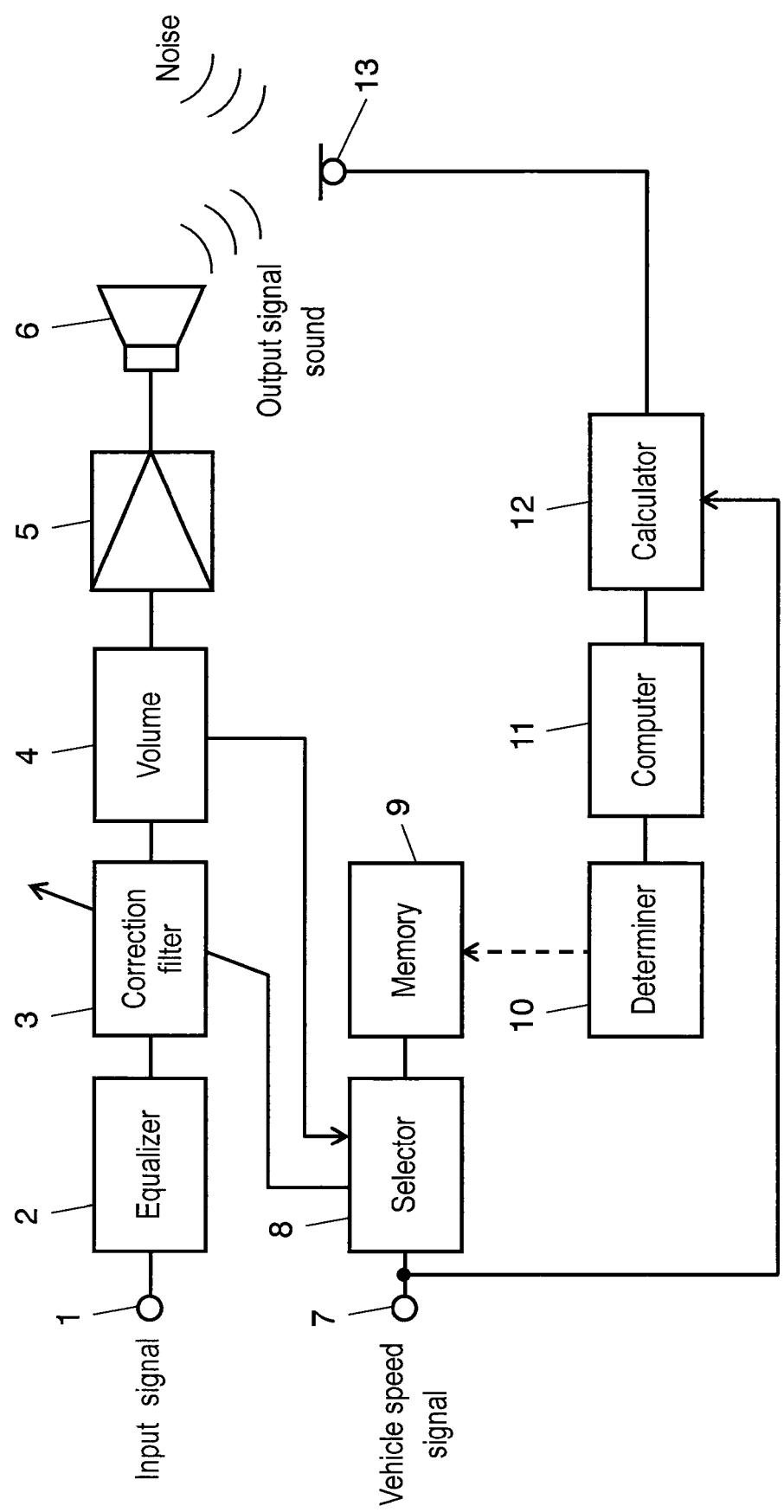
FIG. 1 is a system diagram illustrating a sound reproducing apparatus according to a first embodiment of the invention.

REFERENCE MARKS IN THE DRAWINGS 2 equalizer
3 correction filter
4 volume
5 power amplifier
6 speaker
8 selector
9 memory
10 determiner
11 computer
12 calculator
13 microphone

DETAILED DESCRIPTION OF THE PREFERRED EMBODIMENTS

First Embodiment

Hereinafter, embodiments of the invention will be described with reference to the drawings.

FIG. 1 is a system diagram illustrating a sound reproducing apparatus according to a first embodiment of the invention. In FIG. 1, calculator 12 calculates sound intensities of an inputted reference noise (Lnoise), a driving noise (Lcruise), and a pink noise response sound (Lpink) every arbitrary frequency bandwidth (Bn).

Figure 2:
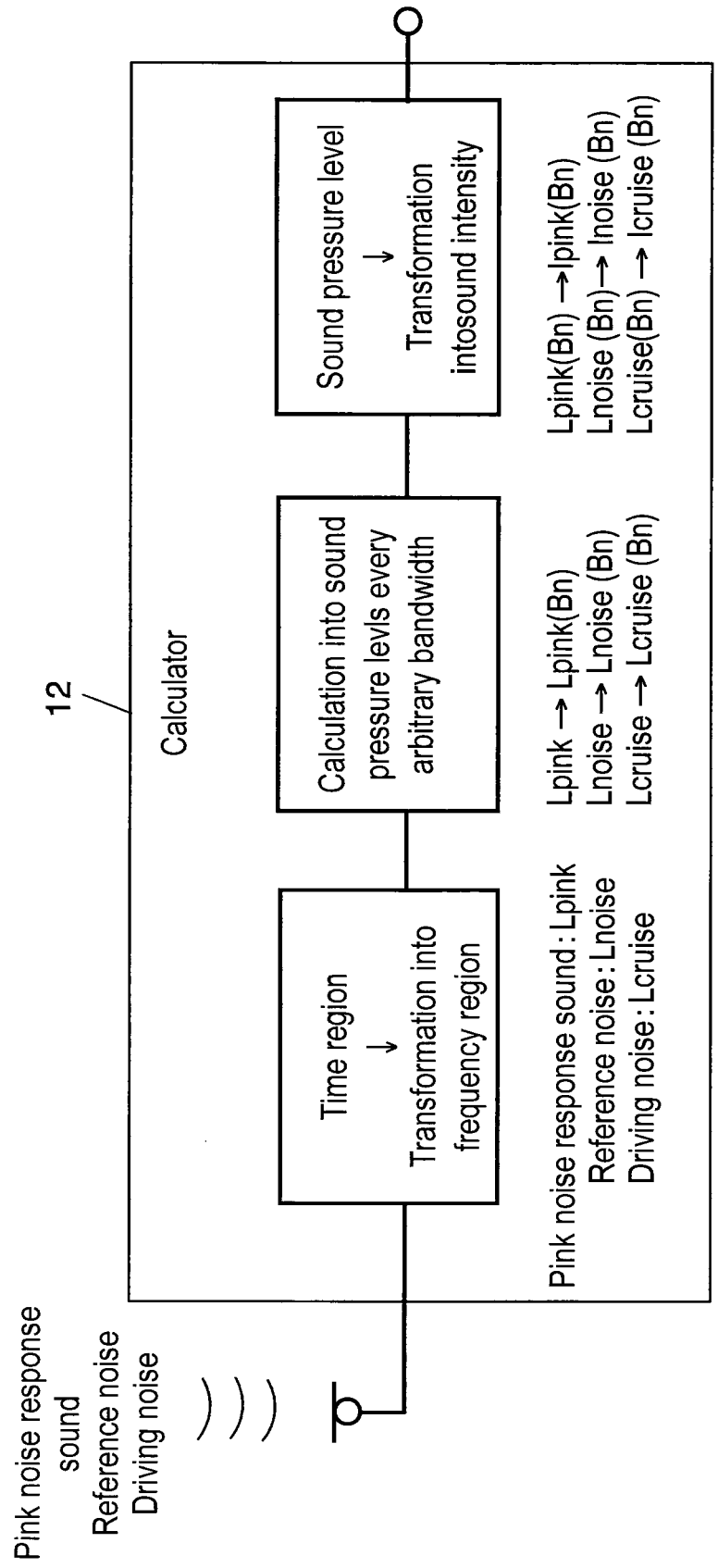
FIG. 2 is a diagram illustrating a calculation step of a sound intensity in each bandwidth in a calculator of the sound reproducing apparatus according to the first embodiment of the invention.

FIG. 2 is a diagram illustrating a calculation step of the sound intensities every bandwidth in a calculator of the sound reproducing apparatus according to the first embodiment of the invention. In FIG. 2, a Fourier Transform, a Wavelet Transform, or the like is used as a transformation method of transforming a time region of an input signal into a frequency region thereof. In addition, as an arbitrary frequency bandwidth (Bn), it is effective to use a threshold bandwidth or ⅓ octave bandwidth. The sound pressure level can be transformed into the sound intensity by Equation (1).

$$I = 10^{L/10} \times I_0 \quad (1)$$

where, L is the sound pressure level, I is the sound intensity, $I_0$ is $10^{-12}$ [W/m$^2$].

Figure 3:
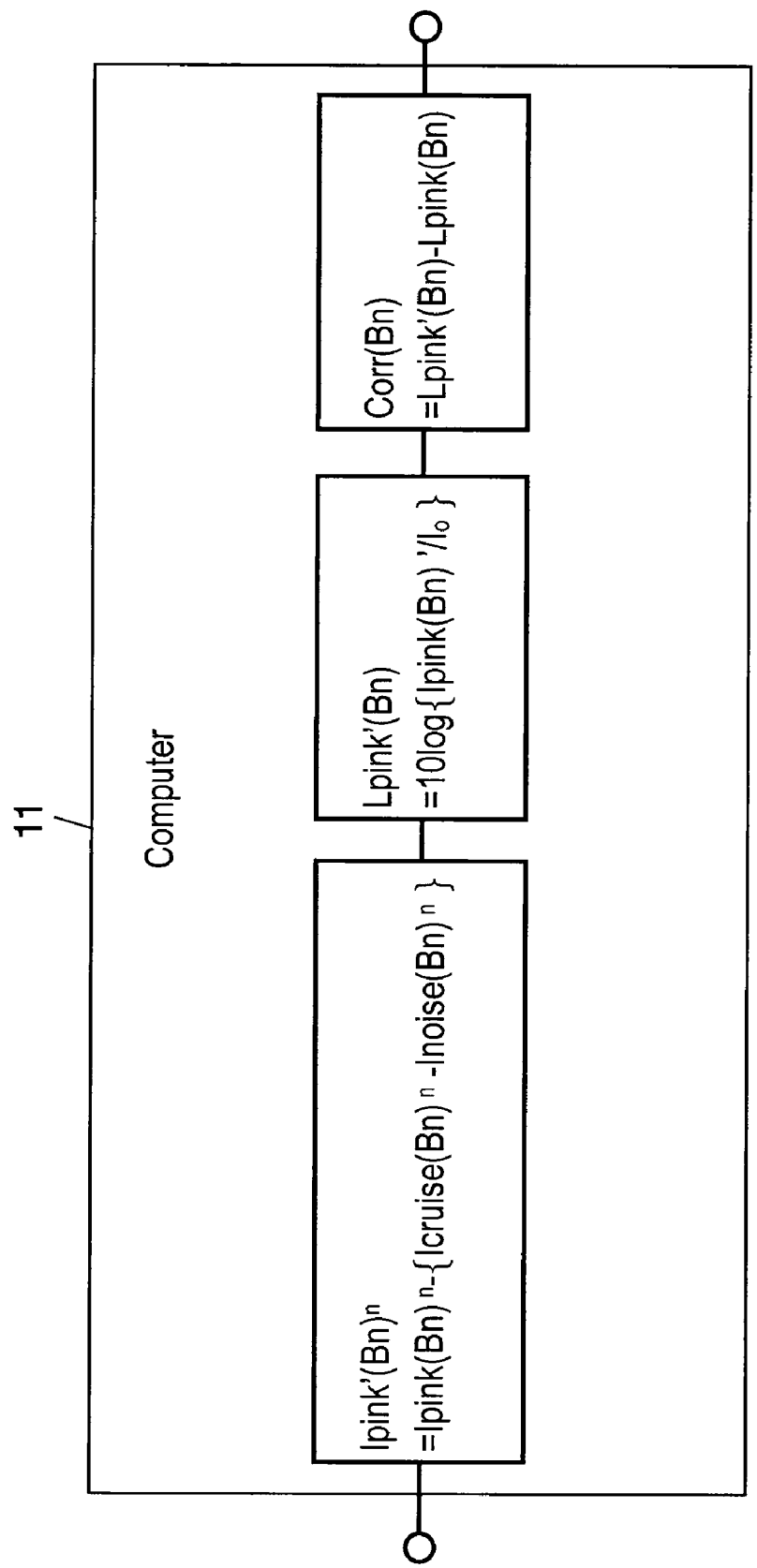
FIG. 3 is a diagram illustrating a computation step of correction amounts every bandwidth in a computer of the sound reproducing apparatus according to the first embodiment of the invention.

FIG. 3 is a diagram illustrating a computation step of correction amounts every ⅓ octave bandwidth in a computer of the sound reproducing apparatus according to the first embodiment of the invention. In FIG. 2, the computer computes the correction amount in each frequency bandwidth on the basis of a calculation result of the calculator. That is, the computer computes the correction amount at an arbitrary frequency by using Steven's Power Law by which a masked sound intensity can be calculated in a noise environment shown in Equation (2).

$$S = k(I^n - I_0^n) \quad (2)$$

where S denotes a sense amount [sone] of the sound intensity, k denotes a coefficient every frequency, and I denotes an intensity of a pure sound. $I_0$ denotes a minimum audible field of the pure sound shifted by the noise. n denotes an experimental value and 0.27 or 0.3 is used frequently.

Intensity S1 of the pink noise response sound when the reference noise exists can be expressed by Equation (3).

$$S1(Bn) = k\{Ipink(Bn)^n - Inoise(Bn)^n\} \quad (3)$$

where Ipink(B$^n$) is the sound intensity of the pink noise in an arbitrary frequency bandwidth (Bn). In addition, Inoise(Bn) denotes the sound intensity of the reference noise in an arbitrary frequency bandwidth (Bn).

Similarly, intensity S2 of the pink noise response sound when the driving noise exists can be expressed by Equation (4).

$$S2(Bn) = k\{Ipink(Bn)^n - Icruise(Bn)^n\} \quad (4)$$

where Icruise(Bn) denotes the sound intensity of the driving noise in an arbitrary frequency bandwidth (Bn).

In the calculation method of the correction amount, as expressed by Equation (5), the intensity of the pink noise response sound when the driving noise exists is corrected to be the same as that of the reference noise.

When Ipink'(Bn)$^n$ is defined so as to be $$k\{Ipink(Bn)^n - Inoise(Bn)^n\} = k\{Ipink'(Bn)^n - Icruise(Bn)^n\} \quad (5)$$

Equation is as the following:

$$Ipink'(Bn)^n = Ipink(Bn)^n - \{Inoise(Bn)^n - Icruise(Bn)^n\} \quad (6)$$

The sound pressure level acquired when Ipink'(Bn) is applied to Equation (1) is expressed by Equation (7).

$$Lpink'(Bn) = 10 \log \{Ipink'(Bn)/I_0\} \quad (7)$$

On the basis of the result, a calculation Equation of the correction amount is expressed by Equation (8).

$$Corr(Bn) = Lpink'(Bn) - Lpink(Bn) \quad (8)$$

Determiner 10 determines a correction parameter of correction filter 3 on the basis of a correction amount Corr(Bn) acquired from calculator 12.

Figure 4:
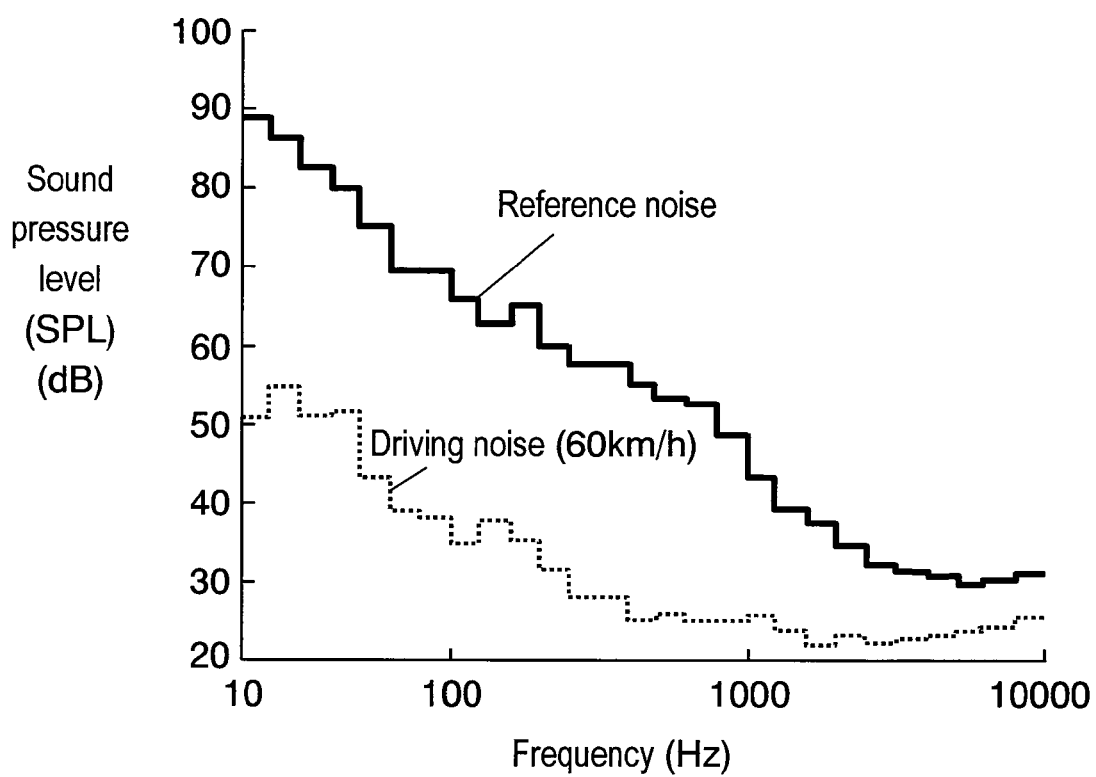
FIG. 4 is a diagram illustrating a sound pressure level in each frequency.

FIG. 4 is a diagram illustrating the sound pressure levels (SPL) of the reference noise and the driving noise at 60 km per hour in each frequency. In FIG. 4, volume 4 is set to −30 dB at the reference noise.

Figure 5:
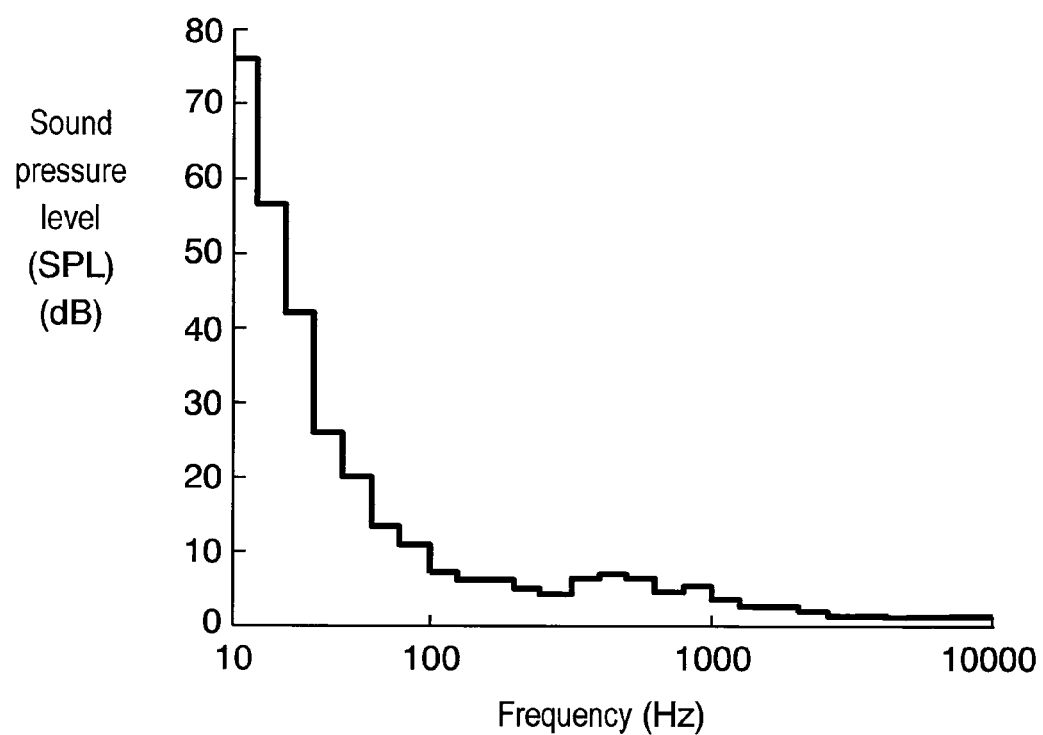
FIG. 5 is a diagram illustrating a correction amount in each frequency when a noise varies from a reference noise to a driving noise at 60 km per hour.

FIG. 5 is a diagram illustrating a correction amount in each frequency when a noise varies from a reference noise to a driving noise at 60 km per hour. On the basis of the correction amount in FIG. 5, determiner 10 determines the correction parameter of correction filter 3 so as to be natural for human ears to hear. Then, determiner 10 stores the determined correction parameter in memory 9.

Figure 6:
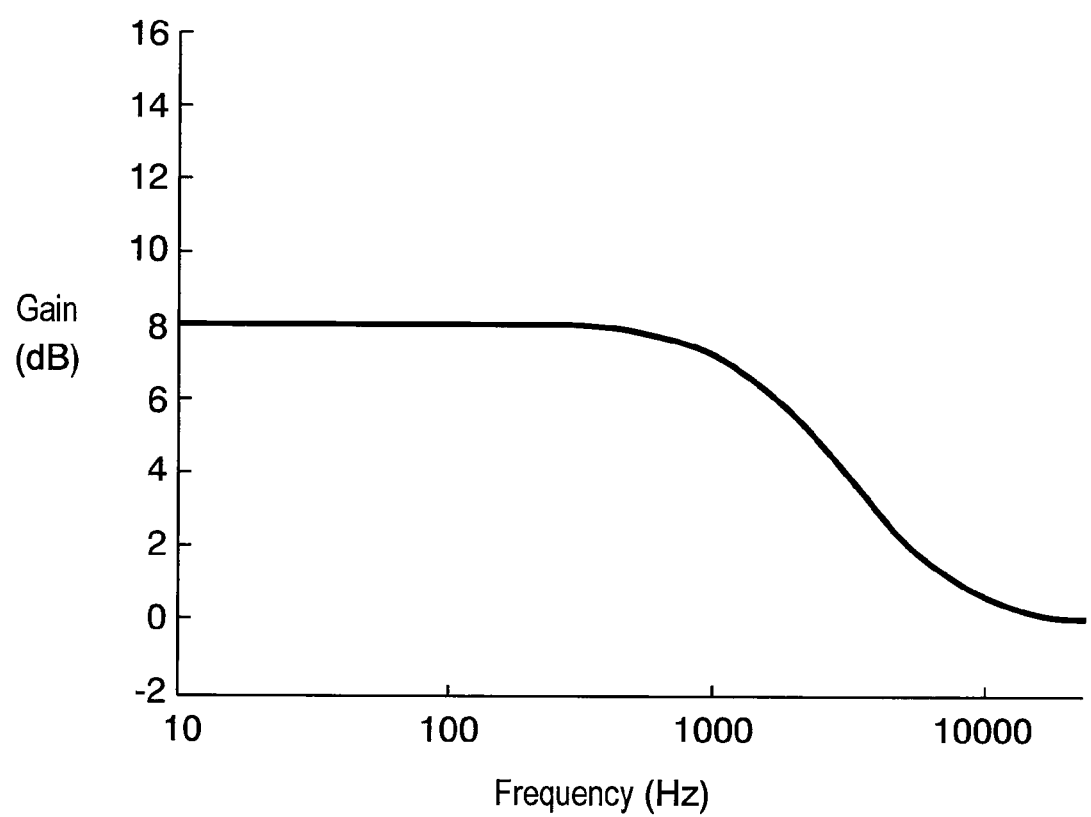
FIG. 6 is a diagram illustrating a gain and a frequency characteristic of a shelving filter acquired from the correction amount in each frequency when the noise varies from the reference noise to a driving noise at 60 km per hour.

FIG. 6 is a diagram illustrating a gain and a frequency characteristic of a shelving filter acquired from the correction amount in each frequency when the noise varies from the reference noise to a driving noise at 60 km per hour. In this way, it is possible to calculate the correction parameter so as to be quantitative and automatic by using the shelving filter in which an average value of two arbitrary points of the correction amount calculated by calculator 12 is set to a gain and a value of one arbitrary point is set to a central frequency.

Figure 7:
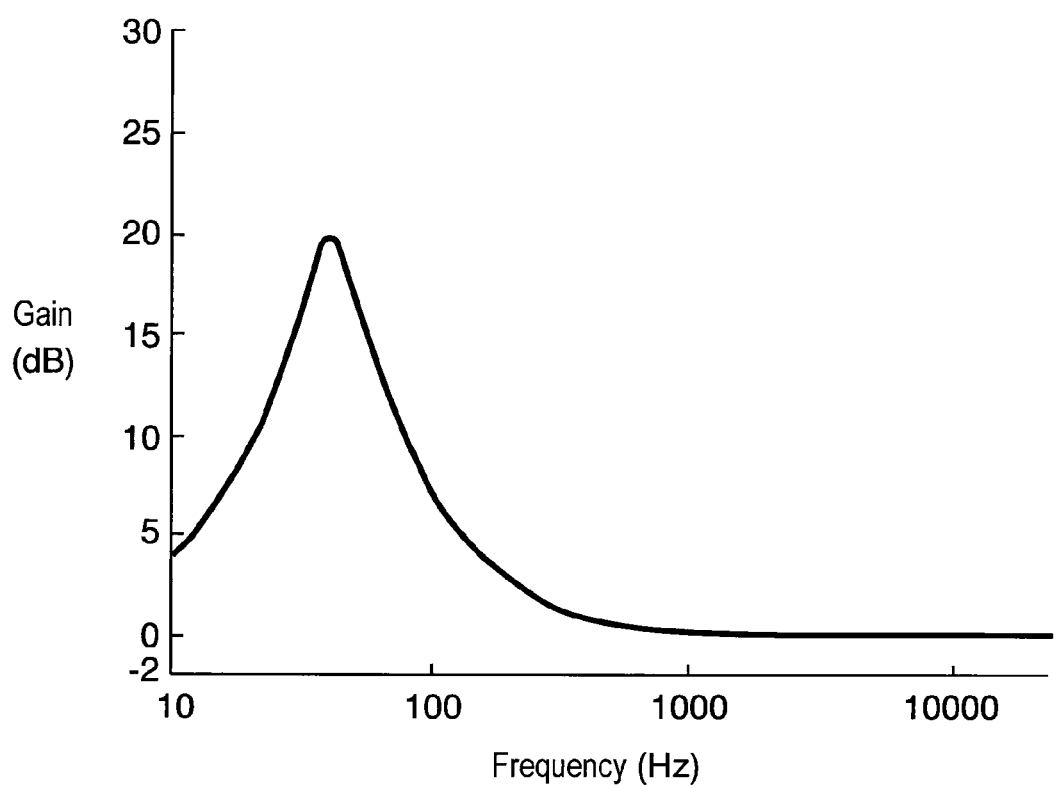
FIG. 7 is a diagram illustrating a gain and a frequency characteristic of a peaking filter acquired from the correction amount in each frequency when the noise varies from the reference noise to a driving noise at 60 km per hour.

FIG. 7 is a diagram illustrating a gain and a frequency characteristic of a peaking filter acquired from the correction amount in each frequency when the noise varies from the reference noise to a driving noise at 60 km per hour. In correction filter 3 performing a correction in a low pass, particularly, it is possible to perform a correction in a low pass so as to be natural for human ears to hear by using the peaking filter in which the lowest resonance frequency of a speaker is set to a central frequency and a value that is attenuated at a uniform rate relative to the correction amount at the central frequency is set to a gain.

When the above-described processes are carried out, and then arbitrary vehicle speed signal 7 is inputted as shown in FIG. 1, selector 8 selects the correction parameter stored in memory 9. The selection process is carried out on the basis of setting values of vehicle speed 7 and volume 4. Selector 8 transmits the selected correction parameter as a control signal to correction filter 3. In correction filter 3, input signal 1 is naturally corrected due to a variation of a frequency characteristic in accordance with the control signal. The series of processes may be automatically carried out. Equalizer 2 has a characteristic fixed in advance so as to adjust a tone of input signal 1.

Vehicle speed signal 7 can be processed as long as it is an analog vehicle speed pulse and a signal operable to determine a vehicle speed such as vehicle speed information transmitted via LAN in a vehicle. Further, in the first embodiment, vehicle speed signal 7 which has a close correlation with the noise during a drive is used, but other signals which have close correlation with the noise may be used for a control instead of vehicle speed signal 7. For example, a signal indicating an engine rotation number may be used. In general, there is a close correlation between the engine rotation number and the driving noise in an arbitrary frequency. In addition, a signal indicating a vibration amount of a vehicle may be used. Since there is a close correlation between the vibration and the noise, the vibration amount can be measured by a vibration sensor. Furthermore, it is possible to improve a performance by arbitrarily combining the signals of the vehicle speed, the engine rotation number, and the vibration sensor.

It is possible to store the reference noise, the driving noise, and the pink noise response in advance and perform calculations of calculator 12, computer 11, and determiner 10 to store them in memory 9 in advance. In this case, it is not necessary to provide microphone 13, calculator 12, computer 11, and determiner 10 for the sound reproducing apparatus. As a result, it is possible to provide the sound reproducing apparatus at a low cost.

When there are a plurality of speakers 6 for radiating a sound by using correction filter 3 with respect to input signal 1, it is not necessary to apply the same correction parameters to all of the speakers. When a speaker having a small diameter like a speaker used for a center speaker has a large amount of low pass correction or when a speaker like an active sub woofer having a gain in advance has a large amount of correction, a large distortion may occur at the time of reproducing a sound.

INDUSTRIAL APPLICABILITY

In a sound reproducing apparatus according to the invention, an input signal can be corrected so as to be natural for human ears to hear even when a noise increases. As a result, it is useful for a head unit, an amp, or the like of a car audio where a noise state varies.

The invention claimed is:

1. A sound reproducing apparatus mounted with a noise responsive controller for correcting an input signal so as not to be masked with a noise caused by an increase in noise with a variation in vehicle speed, the sound reproducing apparatus comprising:
an equalizer having characteristics fixed in advance and adjusting a tone of the input signal;
a correction filter correcting a frequency characteristic of an output signal of the equalizer on the basis of a control signal;
a volume adjusting a gain of an output signal of the correction filter;
a power amplifier receiving an output of the volume as an input;
a speaker sending an output signal of the power amplifier as an output signal sound;
a memory storing a correction parameter in advance;
a selector selecting a correction parameter of the correction filter stored in the memory on the basis of a signal of vehicle speed and a setting value of the volume and transmitting the correction parameter as the control signal to the correction filter;
a microphone;
a calculator;
a computer; and
a determiner,
wherein the microphone mounted on the inside of a vehicle acquires: a pink noise response sound which is an output signal sound from the speaker corresponding to a setting value of each volume of all values of the volume, a reference noise which is a noise during a stop, and a driving noise which includes vehicle speed information at the time of driving at a vehicle speed every predetermined interval, when the input signal is set to a pink noise, a frequency characteristic of the correction filter is set to be flat, and a gain thereof is set to 1,
wherein the calculator calculates sound pressure levels of the pink noise response sound, the reference noise, and the driving noise acquired every multiple bandwidth, and calculates sound intensities on the basis of the sound pressure levels,
wherein the computer computes a correction amount of a frequency characteristic including a gain every multiple bandwidth of the pink noise response sound every vehicle speed in a setting value of each volume of all values of the volume on the basis of a result of the calculator, so as to be the same as a sound intensity when the pink noise response sound is masked with the reference noise when the pink noise response sound is masked with the driving noise, so that a sound intensity becomes small, and
wherein the determiner determines a correction parameter of the correction filter so as to be natural for human ears to hear on the basis of a result of the computer and stores the determined correction parameter in the memory in advance.

2. The sound reproducing apparatus of claim 1,
wherein the correction filter is a shelving filter, and
wherein the determiner sets an average value of correction amounts between bandwidths of two arbitrary points to a gain of the correction filter and sets a bandwidth of one arbitrary point to a central frequency so as to determine the correction parameter.

3. The sound reproducing apparatus of claim 1,
wherein the correction filter is a peaking filter, and
wherein the determiner sets the lowest resonance frequency of the speaker to a central frequency of the correction filter and sets an attenuated value which is attenuated at a uniform rate relative to a correction amount in the central frequency to a gain of the correction filter so as to determine the correction parameter.

4. The sound reproducing apparatus of claim 1, wherein the driving noise is a noise including a signal of an engine rotation number.

5. The sound reproducing apparatus of claim 1, further comprising:
a vibration sensor that senses a vibration of a vehicle, wherein the driving noise is an output signal of the vibration sensor.

* * * * *